United States Patent [19]
Koga et al.

[11] Patent Number: 5,434,648
[45] Date of Patent: Jul. 18, 1995

[54] PROXIMITY EXPOSURE METHOD AND MACHINE THEREFOR

[75] Inventors: Keisuke Koga; Nobufumi Atoda; Tohru Itoh, all of Tokyo, Japan

[73] Assignee: Sortec Corporation, Tokyo, Japan

[21] Appl. No.: 195,764

[22] Filed: Feb. 10, 1994

[30] Foreign Application Priority Data

Apr. 13, 1993 [JP] Japan .................. 5-108745

[51] Int. Cl.$^6$ ............................. G03F 7/20
[52] U.S. Cl. ....................... 355/76; 355/53
[58] Field of Search .................. 355/53, 76

[56] References Cited

U.S. PATENT DOCUMENTS

| | | |
|---|---|---|
| 4,854,495 | 8/1989 | Yamamoto et al. ............ 228/124 |
| 5,168,512 | 12/1992 | Iwamoto et al. ............... 378/34 |
| 5,291,239 | 3/1994 | Jackson ............................ 355/53 |

FOREIGN PATENT DOCUMENTS 4107911  4/1992  Japan .

OTHER PUBLICATIONS

J. Vac. Sci. Technol. B 11(6), Nov./Dec. 1993 pp. 2920-2925: Yanof. A. W., et al.; "X-ray mask membrane motion in narror gap lithography: Hydrodynamic model an exoeriment".

Primary Examiner—M. L. Gellner
Assistant Examiner—Daniel P. Malley
Attorney, Agent, or Firm—Nields & Lemack

[57] ABSTRACT

A proximity exposure method and apparatus therefor. Replications of mask patterns are carried out, wherein as a mask closely approaches a substrate, the displacement of the mask is detected, and the atmospheric pressure between the mask and the substrate, or around the side of the mask opposite the substrate is controlled so as to cancel the displacement of the mask. The apparatus includes positioning apparatus, a light source for exposing the mask pattern, displacement measuring means, and atmospheric pressure controlling means.

7 Claims, 3 Drawing Sheets

FIG_2
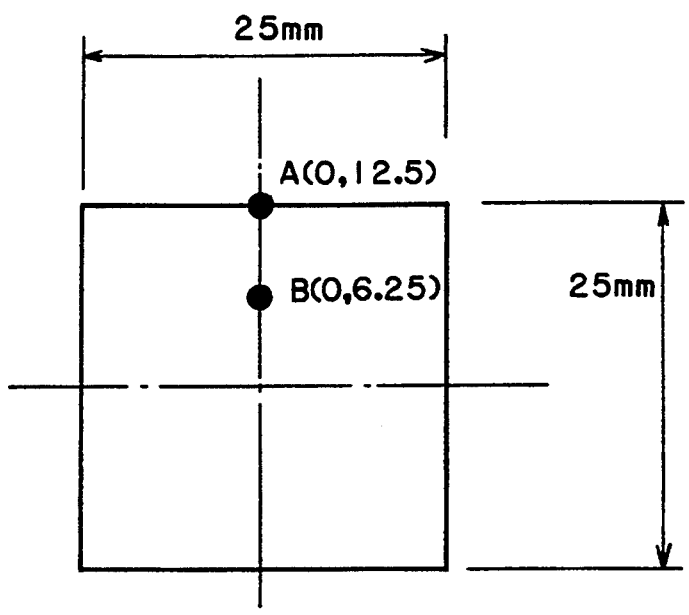
FIG_3
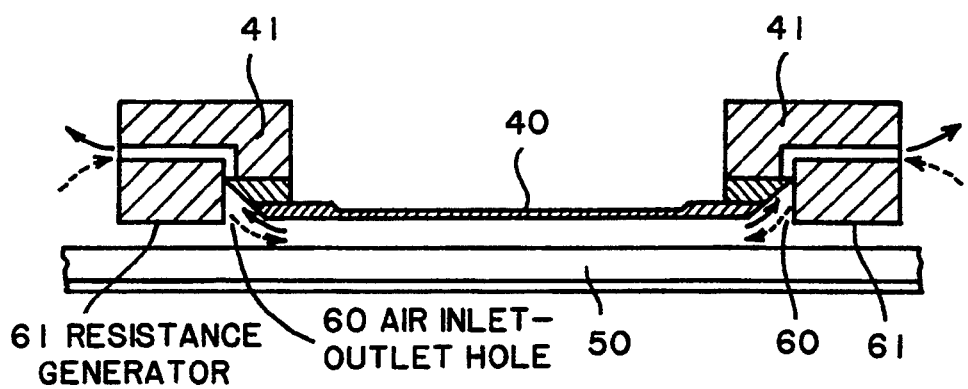

FIG_4
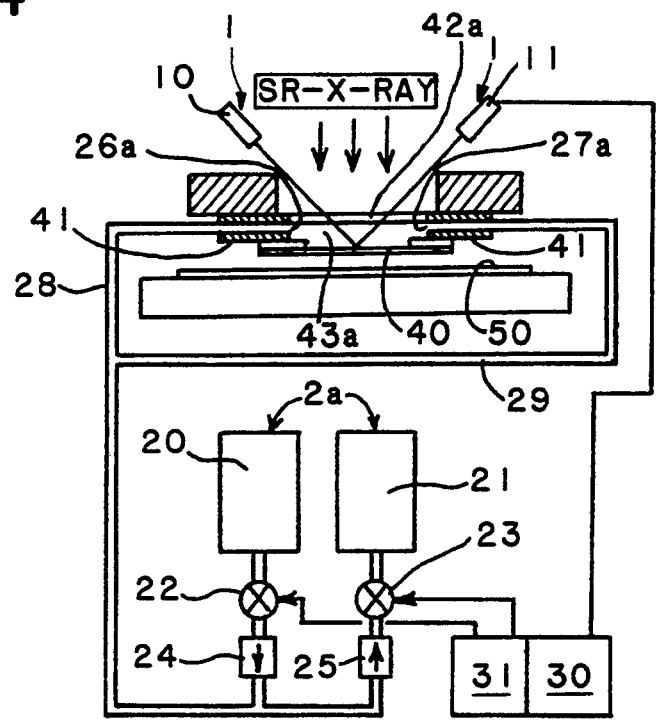
FIG_5
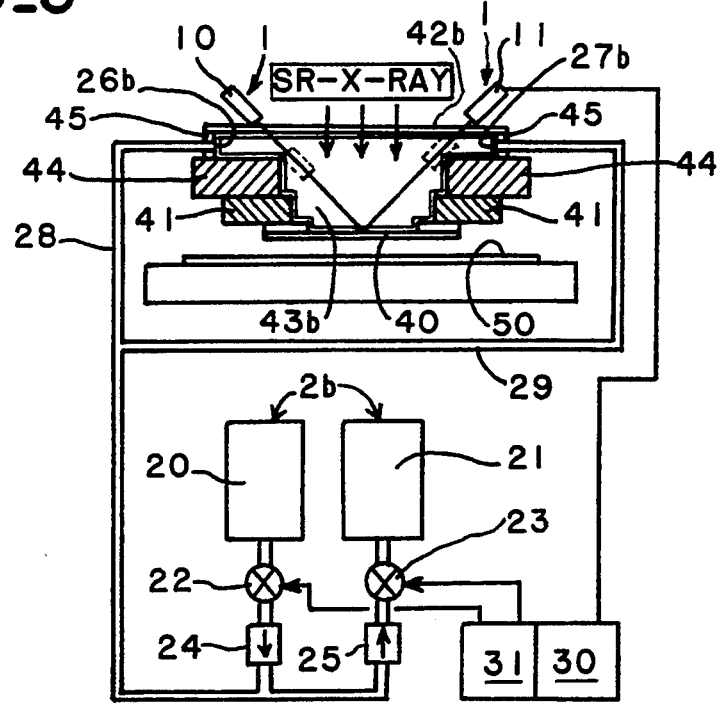

PROXIMITY EXPOSURE METHOD AND MACHINE THEREFOR

TECHNICAL FIELD

The present invention relates to a proximity exposure method and a machine therefor which replicates mask patterns to a substrate such as a wafer for super fine pattern processing of semi-conductors under a condition of closely approaching the mask to the wafer substrate.

BACKGROUND OF THE INVENTION

When exposing a mask and a wafer substrate in an adhesive position, there have been problems of causing patterning badness due to warpings of the mask or the wafer substrate or causing bad adherence therebetween due to a reaction gas, or problems of injuring the mask or the substrate due to dusts or bumps on their surfaces. For avoiding such problems, a proximity exposure method has been performed, which carries out replication of the mask pattern to the wafer substrate by closely approaching the former to the latter.

In a proximity exposure method, the mask makes fine displacements when the substrate is moved in a constant step. The displacement is generated by an atmospheric pressure change which occurs in a small clearance between the mask and the substrate, in particular when both come near or separate from each other.

If the mask pattern were replicated while the fine displacement remains in the mask, a transferring precision would be made inferior. Japan Patent Laid Open No.4-107911, as seen in FIG. 3, discloses a mechanism which opens a gas hole 60 in a support frame 41 outside a mask 40, and disposes a means for charging and discharging the atmoshpere with respect to the clearance between the mask 40 and a substrate 50, thereby to discharge the atmosphere between both when bringing the mask 40 nearer to the substrate 50, and on the other hand compulsively charge the atmosphere into the clearance to be pressurized when bringing farther. In addition, said publication shows a resistance generator 61 outside than the gas hole 60 of the frame supporter 41 in order to control an atmospheric currency with respect to an external for improving the atmospheric charging and discharging efficiency.

Depending upon the above stated mechanism, the approach and separation can be rapidly effected between the mask 40 and the substrate 50. However, said fine displacements of the mask are various by conditions of an atmosphere (an atmospheric air, He, etc.) between the mask 40 and the substrate 50, conditions of moving distances when approaching and separating, or those of deviations of relative center positions of the mask 40 and the substrate 50. And conditions of timing or speed of atmospheric pressure decompression or compression for controlling them are different respectively. In the above stated mechanism, however, when the mask 40 and the substrate 50 approach or separate, the controlling is deviated from the timings or speeds of the pressure decompression or compression suited to each time, because of a sequence control which is carried out for compulsive pressure decompression or compression at a predetermined (fixed) value by the controlling means, and so exact controlling of the atmospheric pressure is troublesome, and it is difficult to speed up the approaching and separating actions of the mask 40 and the substrate 50.

DISCLOSURE OF THE INVENTION

Thus, the present invention has been designed in view of the above mentioned problems involved about the prior art, and is to provide a proximity exposure method and a machine therefor which can rapidly replicate the patterns at high precision without causing influences by mis-positioning or mis-alignment of the pattern by the fine displacements of the mask accompanied with stepping of the substrate.

For accomplishing the objects, in the proximity exposure method of replicating the mask pattern under the condition of closely approaching the mask to the substrate, the invention is basically characterized by comprising detecting displacement of the mask, and controlling the atmospheric pressure between the mask and the substrate or around a rear side of the mask in response to a detected displacement, and practising a feed-back control for cancelling the displacement of the mask.

The above described operation is carried out by means of a following structure. A proximity exposure machine as a second invention is composed of an alignment apparatus for performing a alignment of the mask and the substrate which is to replicate the mask pattern; a light source for exposing said mask pattern; a displacement measuring means which measures said displacement without contacting said mask; an atmospheric pressure controlling means for controlling the atmospheric pressure between the mask and the substrate or around the rear side of the mask; and a control apparatus for sending an atmospheric pressure controlling signal to said atmospheric pressure control means so as to cancel the displacement of the mask in response to said displacement.

Said atmospheric pressure control means which controls the atmospsheric pressure around the rear side of the mask may provide a mechanism which partitions a space around the rear side of the mask by means of a substance, at least one part of which is transparent for an exposing light, thereby to define a rear space of air tightness, and which is provided with a gas hole for said rear space so as to control the atmospheric pressure in the rear space via said gas hole. Further, it is preferable to make the rear space small for improving responsibility of controlling the atmospheric pressure, for which the rear space is defined by partitioning the space in the rear side of the mask of the mask supporting frame by means of the at least substance which is transparent for the exposing light.

The fine displacement of the mask is detected by the displacement measuring means, and the detected signal is processed (e.g., differentiating) by a control apparatus so as to grasp the speed and amount of the displacement, as well as calculate the speed, amount or timing of discharging or charging the atmosphere, which enable to cancel the displacement, and a control signal is sent to the atmospheric pressure controlling means in accordance with a calculated result. Following the received control signal, the atmospheric pressure control means controls the atmospheric pressure due to the discharging or charging so as to cancel the displacement of the mask. If the mask pattern is replicated when the detected displacing amount of the mask goes down below a predetemined value, the replication of the mask pattern can be carried out rapidly and precisely.

BRIEF DESCRIPTION OF THE DRAWINGS

FIG. 2 is a plan view of an exposing field when measuring the positional deviation of the pattern;

FIG. 3 is an explanatory view showing the mechanism of the prior proximity exposure machine;

FIG. 4 is an explanatory view showing a second embodied mechanism of the second invention relating to the proximity exposure method of the present invention used to the X ray exposure; and FIG. 5 is an explanatory view showing a third embodied mechanism of the second invention relating to the proximity exposure method of the present invention used to the X ray exposure.

PREFERABLE EMBODIMENT FOR THE INVENTION

Figure 1:
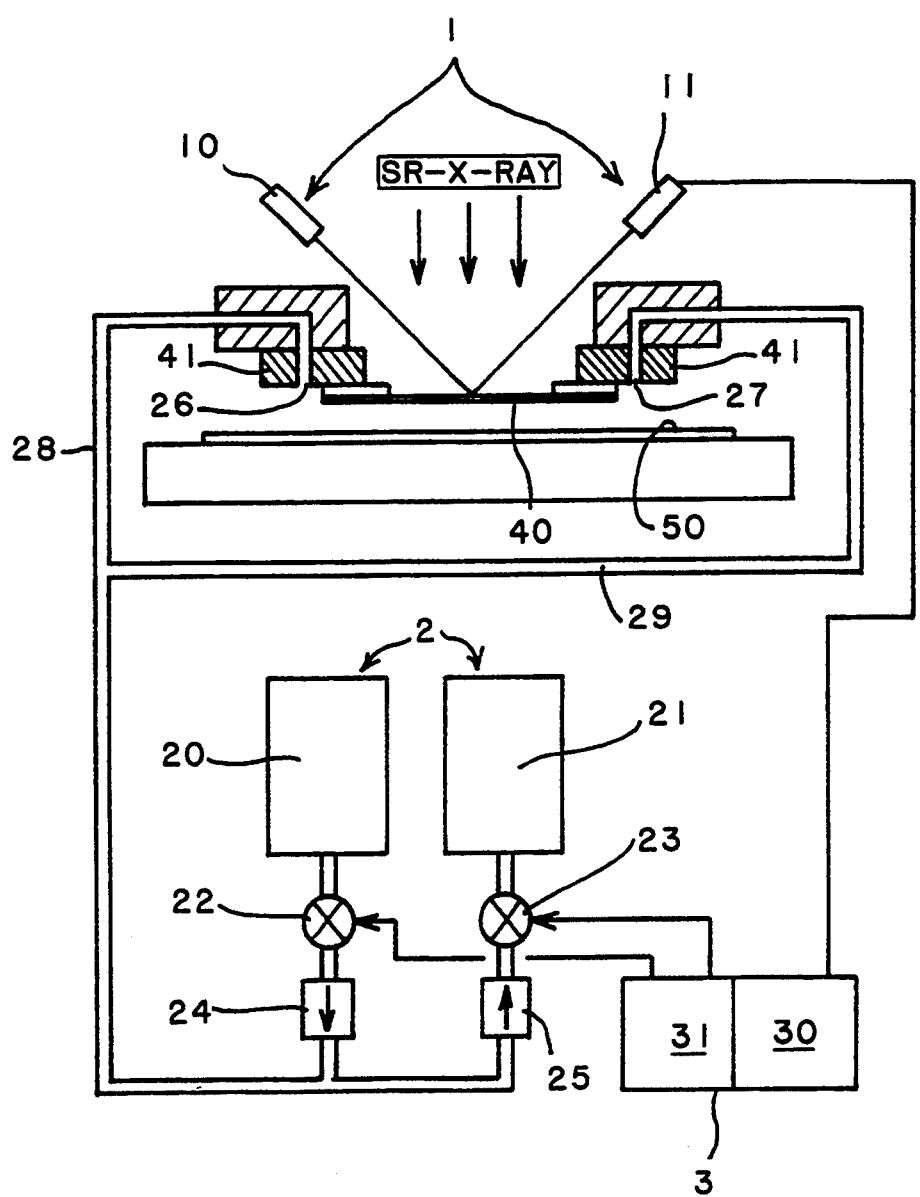
FIG. 1 is an explanatory view showing one embodied mechanism of the proximity exposure machine of the second invention used to the X ray exposure.

Actual embodiments of this invention will be explained with reference to the attached drawings.

FIG. 1 shows one embodied mechanism of the proximity exposure machine of the present invention used to the X ray exposure.

Although not shown in the present embodiment, a synchrotron radiation is employed as the exposing light. The mask pattern of the X ray mask 40 is replicated on the wafer substrate 50 which is being step-moved, by irradiation of the synchrotron radiation issued from a light source. Further, this embodiment has also a positioning apparatus (not shown) for positioning the X ray mask 40 and the wafer substrate 50, said positioning being required to the stepping exposure.

The present embodied exposure device comprises a displacement measuring means 1, an atmospheric pressure control means 2, and a controller 3, said means 1 measuring the displacement of the X ray mask 40, said means 2 controlling the atmospheric pressure between the mask 40 and the wafer substrate 50, and said controllers 3 controlling the atmospheric pressure control means 2 in accordance with the measured displacement of the mask 40.

The displacement measuring means 1 comprises an optical displacement sensor which is composed of a laser beam source 10 emitting the laser beam and a photo detector element 11 receiving said laser beam, and the means 1 measures fine displacements of the X ray mask 40 under the condition of non-contacting.

The atmospheric pressure control means 2 comprises an atmospheric pressure compression tank 20, an atmospheric pressure decompression tank 21, electromagnetic valves 22, 23 therefor, flowing amount controllers 24, 25, gas inlet/outlet 26, 27 defined in the mask supporting frame 41, and conduits 28, 29 connecting with said inlet/outlet. If the valve 22 of the compression tank 20 is opened, a pressurized air is supplied between the X ray mask 40 and the wafer substrate 50 through the inlet/outlet 26 and 27, and if the other valve 23 of the decompression tank 21 is the same, the atmosphere is discharged from the inlet/outlet 26, 27.

The controller 3 comprises a differentiating circuit part 30 and an operation circuit part 31, in which said differentiating circuit part 30 inputs the displacement measuring signal of the mask 40 which has been detected by the displacement measuring means 1, differentiates it there, and calculates the amount and speed of said displacement and said operation circuit part 31 calculates the speed, amount and timing of discharging or charging the atmosphere which enables to cancel said displacement in accordance with a calculated value, and send, basing on said calculated value, the control signal to the electromagnetic valve 22 and 23 of the atmospheric pressure control means 2.

In the above mentioned proximity exposure machine, the fine displacement of the X ray mask 40 is detected by the photo detector element 11 of the displacement measuring means 1, and a detected signal is sent to the differentiating circuit part 30 of the controller 3 and is differentiated there so as to calculate the speed and amount of the displacement as well as calculate the speed, amount and timing of the discharged or charged atmosphere which can cancel said displacement by the operating circuit part 31, basing on the calculated result, and the control signal is sent to the electromagnetic valve 22 or 23 in accordance with a calculated result. The atmospheric pressure control means 2 opens the electromagnetic valve 22 or 23 in accordance with the received control signal, and controls the atmospheric pressure such as discharging or charging in order to cancel the displacement of the mask 40. When the detected displacing amount of the X ray mask 40 goes down below the predetermined value, the mask pattern is replicated to the wafer substrate.

The inventors made the replicating treatment of the X ray mask pattern by means of the proximity exposure machine having the above mechanism and the conventional exposure machine having the mechanism disclosed in said Japan Patent Laid Open No.4-107911, and made experiments for investigating deviations in positionings of the pattern at that time. Cross patterns for valuation were replicated to a resist on the wafer under different conditions depending upon the exposures. After having performed developing treatments thereon, measurements of the deviation in position of the pattern was carried out with a position coordinate measuring laser interferometric system. Said measurement was, as seen in FIG. 2, made at two points A and B within the exposure field of 25 mm square. Results are shown in Table 1. In this connection, a resolution ability of the present measuring system is not more than 10 nm ($3\sigma$), and the difference in deviation between the two machines is meaningful.

TABLE 1

| Measuring points | Systems | |
|---|---|---|
| | The inventive machine | The conventional machine |
| The deviation amount of positioning the pattern A | $\leq 10$ nm | 25 nm |
| The deviation amount of positioning the pattern B | $\leq 10$ nm | 25 nm |

As is apparent from the above Table, in the mechanism of the conventional exposure machine, the deviation amount in positioning of the pattern on the wafer substrate 50 had a relatively large value as around 25 nm on the perimeter of the exposure field of 25 mm square. On the other hand, in the mechanism of the exposure machine of the present embodiment, the deviation amount in positioning of the pattern was not more than 10 nm, that is, a similar amount of the resolution ability of the measuring system. There was little deviation amount in positioning of the exposure machine in the present embodiment, and thus the pattern replicating machine of the present embodiment can carry out the pattern replication rapidly and at high precision in comparison with the conventional exposure machine.

FIG. 4 shows another embodied mechanism of the exposure machine as the second invention relating to the practice for the inventive proximity exposure method used to the X ray exposure, having almost the same mechanism as in the above embodiment, The present embodiment has a displacement measuring means 1 for measuring the displacement of said X ray mask 40, an atmospheric pressure control means 2a for controlling the atmospheric pressure staying around the rear side of the mask 40, and a controller 3 for controlling the atmospheric pressure control means 2a in accordance with the measured displacement of the mask 40. Since the displacement measuring device 1 and the controller 3 are the same as the above mechanism, the same reference numerals are given and detailed explanations therefor will be omitted.

In the atmospheric pressure control means 2a, the same structures are provided with respect to the atmospheric pressure compression tank 20, the atmospheric pressure decompression tank 21, the electromagnetic valves 22, 23 therefor, the flowing amount control apparatuses 24, 25, the conduits 28, 29. On the other hand, the upper surface of the mask supporting frame 41 is covered with a silicon nitride 42a which is transparent to the laser beam of the displacement measuring means 1 and the exposing light, thereby to partition the space of the rear side of the X ray mask 40 (i.e. the opposite face to the side directing to the wafer substrate 50), so that an air tight space 43a is defined, and the gas inlet and outlet 26a, 27a formed in the mask supporting frame 41 open toward the rear space 43a. In the above mechanism, if the electromagnetic valve 22 of the atmospheric pressure compression tank 20 is opend, the pressurized gas is supplied into the space 43a at the rear side of the X ray mask 40 through the holes 26a, 27a, and if the electromagetic valve 23 of the atmospheric pressure decompression valve 21 is opened, the atmosphere is discharged from the space 43a via the holes 26a and 27a.

Since the space for controlling the atmospheric pressure in this embodiment is the rear space of a small capacity defined air-tightly at the rear side of the mask, the responsibility to the atmospheric pressure control is far improved than the above stated embodiment.

FIG. 5 shows another embodied mechanism of the exposure machine as the second-invention relating to the practice for the inventive proximity exposure method used to the X ray exposure, having almost the same mechanism as in the above embodiment, and the same reference numerals are given to the same parts, and detailed description therefor will be omitted.

In this embodiment, the following mechanism is provided as the atmospheric pressure control means 2b. The upper surface of the mask stage 44 is covered, via the supporting frame 45 keeping the air tightness, with the silicon nitride 42b which is transparent to the laser beam of the displacement measuring means 1 and the exposure light, thereby to partition the space at the rear side of the X ray mask 40, so that the air tight space is defined, and the inlet and outlet 26b, 27b defined in the supporting framce 45 open toward the rear space 43b.

Since the control of the atmospheric pressure of the rear space 43b is the same as in the above embodiment, explanations therefor will be omitted. The same may be also applied to the improved responsibility of the atmospheric pressure control.

The inlet and the outlet 26b, 27b opening toward the rear space 43b may be defined in the mask stage 44, or the displacement detecting means 1 may be disposed in the rear space 43b (as seen by the dotted line in FIG. 3). In such a mechanism, it is possible to use, as the partitioning film, a substance which is not transparent to the laser beam, for example, beryllium, instead of silicon nitride 42b.

INDUSTRIAL APPLICABILITY

In accordance with the present invention, it is possible to control the fine displacements of the mask, and replicate the mask pattern rapidly and at high precision without the influence by deviations in the pattern.

What is claimed is:

1. A proximity exposure method of carrying out replications of mask patterns wherein a mask closely approaches a substrate, comprising detecting a displacement of the mask, and controlling an atmospheric pressure between the mask and the substrate in response to a detected displacement so as to cancel the displacement of the mask.

2. The method as claimed in claim 1, wherein said displacement of the mask is corrected to below a predetermined value.

3. A proximity exposure machine which replicates mask patterns to a substrate wherein a mask closely approaches a substrate, said machine having a light source for exposing the mask pattern, comprising displacement measuring means which measures the displacement of said mask without contacting said mask; atmospheric pressure controlling means for controlling the atmospheric pressure between the mask and the substrate, and a controlling apparatus for sending an atmospheric pressure controlling order to said atmospheric pressure controlling means so as to cancel the displacement of the mask in response to said displacement.

4. The machine as claimed in claim 3, wherein said atmospheric pressure controlling means which controls the atmospheric pressure around said second side of said mask, comprises a structure which partitions a space around the second side of the mask by means of a substance, at least one part of which is transparent to an exposing light, thereby an air tight rear space, said rear space having gas inlet and outlet holes, so that the atmospheric pressure is controlled in said rear space via said gas inlet and outlet holes.

5. The machine as claimed in claim 4, wherein said rear space is partitioned by means of a substance which is transparent to at least the exposing light from said light source, thereby defining a rear space of air tightness.

6. A proximity exposure method of carrying out replications of mask patterns wherein a mask closely approaches a substrate, said mask having a first side facing said substrate and a second side facing in a direction opposite said substrate, comprising detecting a displacement of the mask, and controlling an atmospheric pressure around said second side of said mask in response to a detected displacement so as to cancel the displacement of the mask.

7. A proximity exposure machine which replicates mask patterns to a substrate wherein a mask closely approaches a substrate, said machine having a light source for exposing the mask pattern, said mask having a first side facing said substrate and a second side facing in a direction opposite said substrate, said machine comprising displacement measuring means which measures the displacement of said mask without contacting said mask; atmospheric pressure controlling means for controlling the atmospheric pressure around said second side of said mask; and a controlling apparatus for sending an atmospheric pressure controlling order to said atmospheric pressure controlling means so as to cancel the displacement of the mask in response to said displacement.

* * * * *